(12) United States Patent
Waite et al.

(10) Patent No.: US 7,235,433 B2
(45) Date of Patent: Jun. 26, 2007

(54) SILICON-ON-INSULATOR SEMICONDUCTOR DEVICE WITH SILICON LAYERS HAVING DIFFERENT CRYSTAL ORIENTATIONS AND METHOD OF FORMING THE SILICON-ON-INSULATOR SEMICONDUCTOR DEVICE

(75) Inventors: Andrew M. Waite, Wappingers Falls, NY (US); Jon Cheek, Cedar Park, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 41 days.

(21) Appl. No.: 10/976,780

(22) Filed: Nov. 1, 2004

(65) Prior Publication Data

US 2006/0091427 A1    May 4, 2006

(51) Int. Cl.
  *H01L 21/84* (2006.01)
(52) U.S. Cl. .................. 438/149; 438/311; 438/168
(58) Field of Classification Search ............... 438/149, 438/311, 168
  See application file for complete search history.

(56) References Cited

U.S. PATENT DOCUMENTS

| | | | |
|---|---|---|---|
| 5,894,152 A * | 4/1999 | Jaso et al. ............... | 257/347 |
| 6,063,652 A * | 5/2000 | Kim .......................... | 438/155 |
| 6,107,125 A * | 8/2000 | Jaso et al. ............... | 438/149 |
| 6,214,694 B1 * | 4/2001 | Leobandung et al. ...... | 438/413 |
| 6,222,234 B1 | 4/2001 | Imai | |
| 6,326,247 B1 | 12/2001 | Krishnan et al. | |
| 6,429,488 B2 * | 8/2002 | Leobandung et al. ...... | 257/354 |
| 6,448,114 B1 | 9/2002 | An et al. | |
| 6,476,445 B1 * | 11/2002 | Brown et al. ............... | 257/347 |
| 6,492,209 B1 | 12/2002 | Krishnan et al. | |

(Continued)

FOREIGN PATENT DOCUMENTS

EP    0 331 811 A2    9/1989

(Continued)

OTHER PUBLICATIONS

M. Yang et al., "High Performance CMOS Fabricated on Hybrid Substrate With Different Crystal Orientations". International Electon Devices Meeting 2003. IEDM. Technical Digest. Washington, DC, Dec. 8-10, 2003, New York, NY: IEEE, US, Dec. 8, 2003, pp. 453-456.

(Continued)

*Primary Examiner*—Andy Huynh
*Assistant Examiner*—David Goodwin

(57) ABSTRACT

A semiconductor device comprising a substrate having a first crystal orientation and an insulating layer overlying the substrate is provided. A plurality of silicon layers are formed overlying the insulating layer. A first silicon layer comprises silicon having the first crystal orientation and a second silicon layer comprises silicon having a second crystal orientation. In addition, a method of forming a semiconductor device providing a silicon-on-insulator structure comprising a substrate with a silicon layer overlying the substrate and a first insulating layer interposed therebetween is provided. An opening is formed in a first region of the silicon-on-insulator structure by removing a portion of the silicon layer and the first insulating layer to expose a portion of the substrate layer. Selective epitaxial silicon is grown in the opening. A second insulating layer is formed in the silicon grown in the opening to provide an insulating layer between the grown silicon in the opening and the substrate.

14 Claims, 11 Drawing Sheets

U.S. PATENT DOCUMENTS

| | | |
|---|---|---|
| 6,537,891 B1 | 3/2003 | Dennison et al. |
| 6,558,994 B2 | 5/2003 | Cha et al. |
| 6,664,146 B1 * | 12/2003 | Yu .............................. 438/149 |
| 6,677,646 B2 * | 1/2004 | Ieong et al. ................. 257/347 |
| 6,724,046 B2 * | 4/2004 | Oyamatsu ................... 257/347 |
| 6,830,962 B1 * | 12/2004 | Guarini et al. .............. 438/149 |
| 6,835,981 B2 * | 12/2004 | Yamada et al. ............. 257/347 |
| 6,855,976 B2 * | 2/2005 | Nagano et al. ............. 257/305 |
| 6,891,228 B2 * | 5/2005 | Park et al. .................. 257/346 |
| 6,949,420 B1 * | 9/2005 | Yamashita ................. 438/149 |
| 2004/0195646 A1 | 10/2004 | Yeo et al. |

FOREIGN PATENT DOCUMENTS

| | | |
|---|---|---|
| JP | 60-154548 | 8/1985 |
| WO | WO 2005/057631 A2 | 6/2005 |
| WO | WO 2005/124871 A2 | 12/2005 |

OTHER PUBLICATIONS

Yang et al., "High Performance CMOS Fabricated on Hybrid Substrate With Different Crystal Orientations", 2003 IEEE, pp. 18.7.1-18.7.4.

Chau et al., A 50nm Depleted-Substrate CMOS Transistor (DST), 2001 IEEE, pp. 29.1.1-29.1.4.

Julian Blake, SIMOX (Separation by Implantation of Oxygen), Encyclopedia of Physical Science and Technology, Third Edition, vol. 14, pp. 805-813.

* cited by examiner

SILICON-ON-INSULATOR SEMICONDUCTOR DEVICE WITH SILICON LAYERS HAVING DIFFERENT CRYSTAL ORIENTATIONS AND METHOD OF FORMING THE SILICON-ON-INSULATOR SEMICONDUCTOR DEVICE

TECHNICAL FIELD

The present invention relates to semiconductor devices and methods of manufacturing semiconductor devices and, more particularly, to an improved semiconductor device comprising silicon-on-insulator (SOI) technology.

BACKGROUND OF THE INVENTION

An important aim of ongoing research in the semiconductor industry is increasing semiconductor performance while decreasing power consumption in semiconductor devices. Planar transistors, such as metal oxide semiconductor field effect transistors (MOSFETs) are particularly well suited for use in high-density integrated circuits. As the size of MOSFET and other devices decrease, the dimensions of source/drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness on the order of 1000 Å or less, are generally required for acceptable performance in short channel devices.

Silicon-on-insulator (SOI) technology allows the formation of high-speed, shallow-junction devices. In addition, SOI devices improve performance by reducing parasitic junction capacitance.

In a SOI substrate, a buried oxide (BOX) film made of silicon oxide is formed on single crystal silicon, and a single crystal silicon thin film is formed thereon. Various methods for fabricating such SOI substrates are known. One such method is Separation-by-Implanted Oxygen (SIMOX), wherein oxygen is ion implanted into a single crystal silicon substrate to form a buried oxide (BOX) film.

Another method of forming a SOI substrate is wafer bonding, wherein two semiconductor substrates with silicon oxide surface layers are bonded together at the silicon oxide surfaces to form a BOX layer between the two semiconductor substrates.

Another SOI technique is Smart Cut®, which also involves bonding first and second semiconductor substrates through oxide layers. In the Smart Cut® method, the first semiconductor substrate is implanted with hydrogen ions prior to bonding. The hydrogen ion implanting subsequently allows the hydrogen ion implanted semiconductor substrate to be split from the bonded substrates leaving behind a thin layer of silicon bonded to the surface of the second semiconductor substrate.

Semiconductor device performance can be further enhanced by 50% or more by fabricating a P-type MOSFET (PMOSFET) on silicon with a <110> crystal orientation rather than a conventional <100> orientation. However, the performance of a N-type MOSFET (NMOSFET) formed on <110> silicon may be degraded compared to a NMOSFET formed on silicon with a <100> orientation.

Semiconductor device performance can also be enhanced by fabricating fully depleted MOSFETs on very thin silicon films, such as films with a thickness of about 30 nm or less. Fully depleted MOSFETs provide reduced current leakage and are desirable for high performance devices. However, it is difficult to modify the threshold voltage of fully depleted MOSFETs with conventional techniques, such as adjusting a halo dose. It is desirable to modify the threshold voltage of MOSFETs to create high and low threshold voltage devices. Semiconductor devices comprising MOSFETs with a range of different threshold voltages reduces the power consumption of the chip.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for a device that combines the performance improvements of SOI technology and fully depleted MOSFET technology. There exists a need in the semiconductor device art for a device that combines the performance improvements of SOI technology and MOSFETs formed on silicon with different crystal orientations on the same substrate. In addition, there exists a need in this art to provide a semiconductor device that combines SOI technology, fully depleted MOSFET technology, and MOSFETs formed on silicon having different crystal orientations on the same substrate. Further, there exists a need in this art for methodology for forming semiconductor devices comprising SOI technology and fully depleted MOSFET technology. There also there exists a need in this art for methodology for forming semiconductor devices comprising SOI technology and MOSFETs formed on silicon having different crystal orientations on the same substrate. Furthermore, there exists a need in this art for methodology for forming semiconductor devices comprising SOI technology, fully depleted MOSFET technology, and MOSFETs formed on silicon having different crystal orientations formed on the same substrate.

These and other needs are met by certain embodiments of the present invention, which provide a semiconductor device comprising a substrate having a first crystal orientation and an insulating layer overlying the substrate. A plurality of silicon layers are formed overlying the insulating layer. A first silicon layer comprises silicon having the first crystal orientation, and a second silicon layer comprises silicon having a second crystal orientation.

These and other needs are further met by certain embodiments of the present invention which provide a method of forming a semiconductor device comprising providing a silicon-on-insulator structure comprising a substrate with a silicon layer overlying the substrate and a first insulating layer interposed therebetween. An opening is formed in a first region of the silicon-on-insulator structure by removing a portion of the silicon layer and the first insulating layer to expose a portion of the substrate layer. Selective epitaxial silicon is grown into the opening. A second insulating layer is formed in the silicon grown in the opening in the first region to provide an insulating layer between the grown silicon in the opening and the substrate.

This invention addresses the needs for an improved high-speed semiconductor device with improved electrical characteristics.

The foregoing and other features, aspects, and advantages of the present invention will become apparent in the following detailed description of the present invention when taken in conjunction with the accompanying drawings.

DETAILED DESCRIPTION OF THE INVENTION

Figure 1:
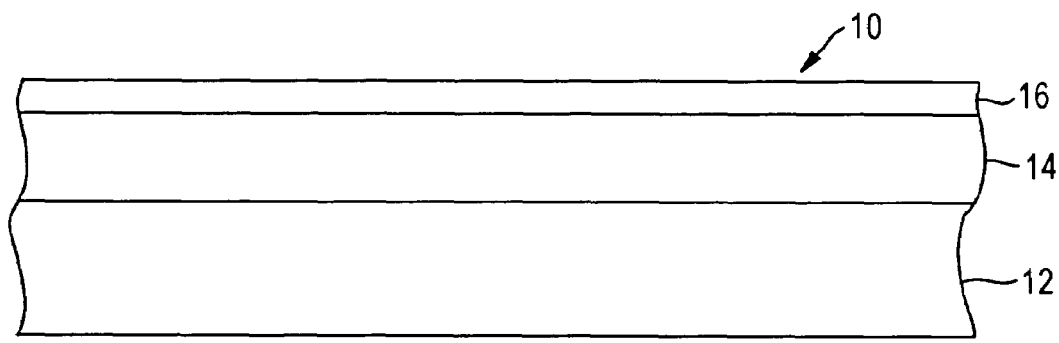
FIGS. 1-14 illustrate the formation of a SOI semiconductor device with partially depleted and fully depleted MOSFETs on the same substrate.

The present invention enables the production of improved high-speed semiconductor devices with the benefits of SOI and fully depleted MOSFET technology, and/or MOSFETs formed on silicon having different crystal orientations on the same substrate. The present invention further provides the higher speed offered by fully depleted technology and/or PMOSFETs formed over silicon with different crystal orientations with the reduced parasitic junction capacitance benefits of SOI technology.

The invention will be described in conjunction with the formation of the semiconductor devices illustrated in the accompanying drawings. However, this is exemplary only as the claimed invention is not limited to the formation of the specific devices illustrated in the drawings.

A method of forming a semiconductor device having fully depleted and partially depleted MOSFETs on a common SOI substrate will be described first. A SOI structure 10 is provided with a silicon layer 16 and an insulating layer 14 overlying a substrate 12. The substrate 12 is typically a silicon wafer. The insulating layer 14 is a buried oxide (BOX) layer. The SOI structure 10, as illustrated in FIG. 1, can be formed by conventional techniques, such as SIMOX, Smart Cute®, or wafer bonding techniques. Alternately, SOI wafers can be obtained from commercial sources, such as Ibis Technology Corporation. In certain embodiments of the present invention, the silicon layer 16 has a thickness of about 30 nm or less, so as to enable the fabrication of fully depleted SOI devices. In certain embodiments of the present invention, the BOX layer 14 has a thickness of from about 50 nm to about 400 nm. In certain embodiments of the invention, the BOX layer 14 has a thickness of from about 200 nm to about 300 nm.

Figure 2:
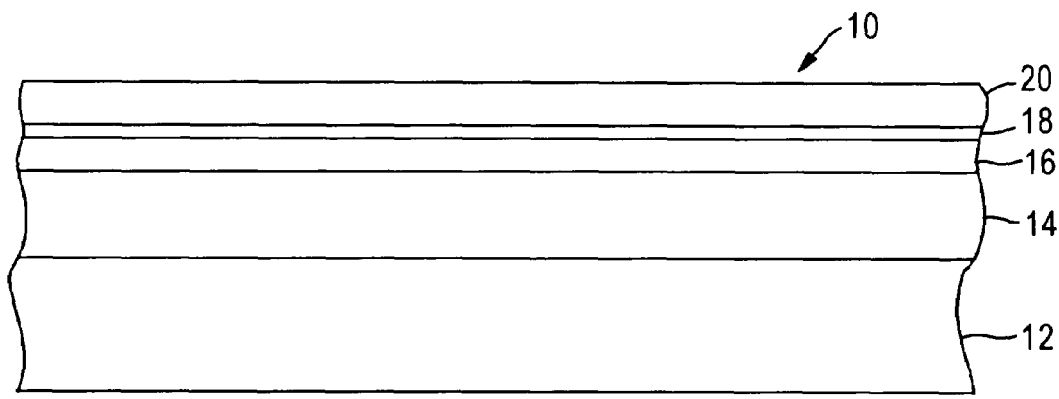

As illustrated in FIG. 2, an oxide layer 18 is formed over the silicon layer 16. The oxide layer 18 can be deposited, such as by chemical vapor deposition (CVD), or the top surface of the silicon layer 16 can be thermally oxidized. A silicon nitride film 20 is subsequently deposited over the oxide layer 18. The thickness of the oxide layer 18, in certain embodiments of the present invention, ranges from about 5 nm to about 100 nm. In certain embodiments of the present invention, the oxide layer 18 is about 20 nm thick. The nitride layer 20 has a thickness of about 50 nm to about 300 nm. In certain embodiments of the present invention, the thickness of the nitride layer 20 is about 100 nm.

Figure 3:
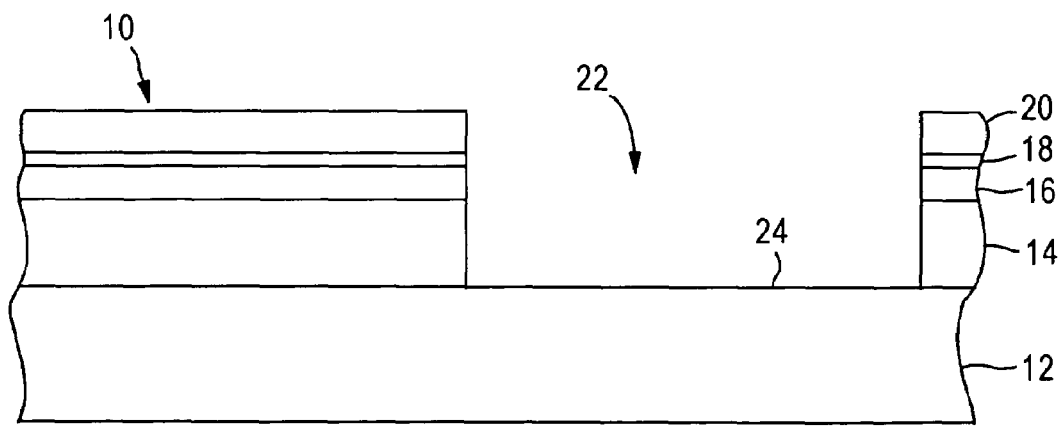

An opening 22 is subsequently formed in the SOI structure 10, as illustrated in FIG. 3. In certain embodiments of the present invention, the opening 22 is formed by conventional photolithographic and etching techniques to expose an upper surface 24 of the substrate 12. Conventional photolithographic and etching techniques include forming a resist layer over the SOI structure 10, masking and patterning the resist layer, and anisotropic etching of the SOI structure 10 to remove portions of the silicon nitride layer 20, oxide layer 18, silicon layer 16, and the BOX layer 14, exposing the upper surface 24 of the substrate 12. The photoresist is subsequently stripped to provide the SOI structure 10 as shown in FIG. 3. Conventional anisotropic etching techniques include plasma etching and reactive ion etching. Anisotropic etching can alternately be carried out in a series of plasma etching steps using different known plasmas that optimally etch the various different layers.

Figure 4:
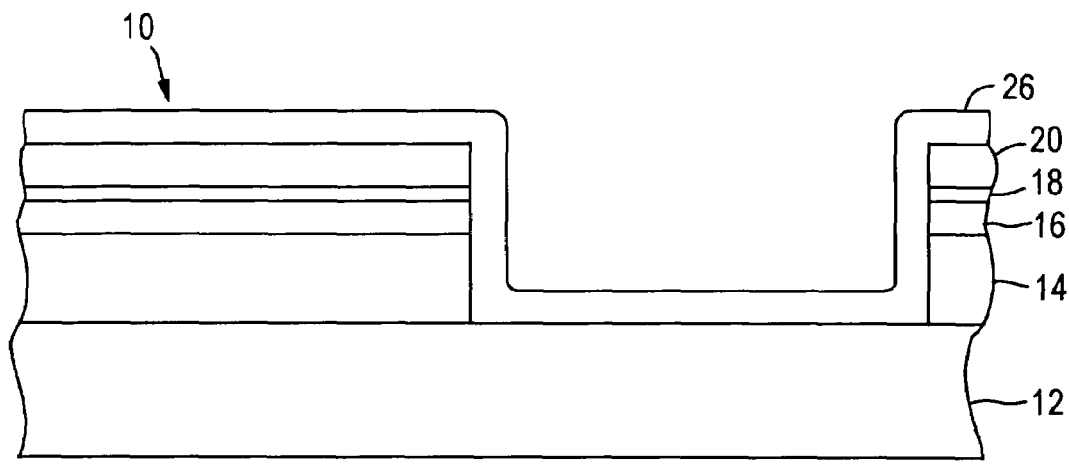
Figure 5:
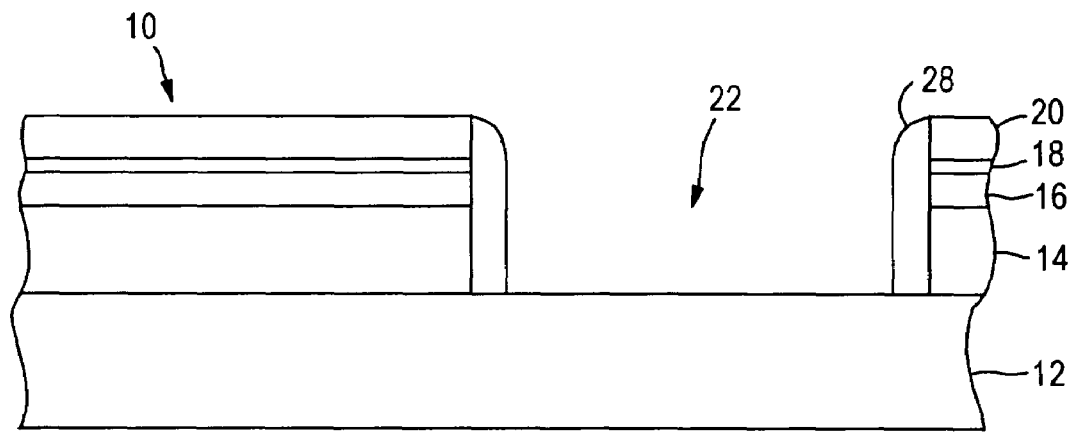

A second silicon nitride layer 26 is subsequently deposited over the SOI structure 10, as illustrated in FIG. 4. In certain embodiments of the invention, the silicon nitride layer 26 is deposited to a thickness of from about 10 nm to about 100 nm by a conventional deposition technique, such as CVD. The silicon nitride layer 26 is subsequently anisotropically etched to form self-aligned sidewall spacers 28 ordering the opening 22, as shown in FIG. 5.

Figure 6:
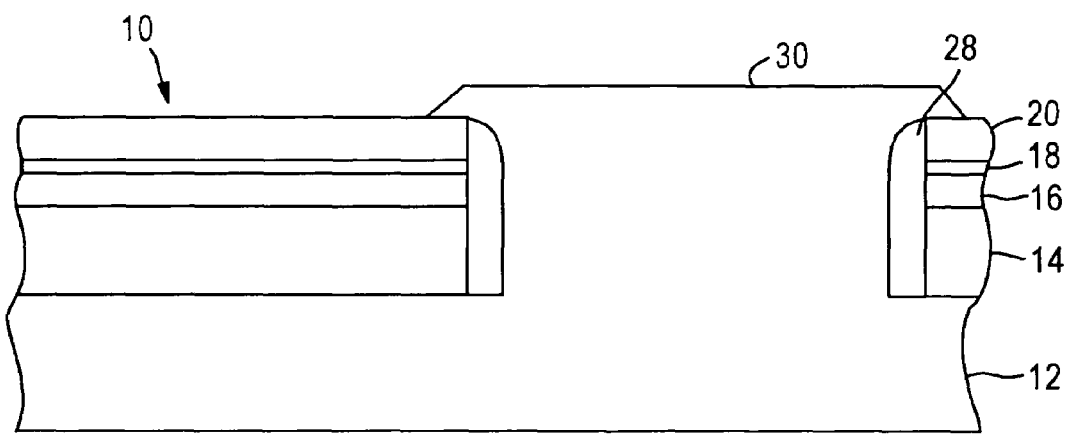
Figure 7:
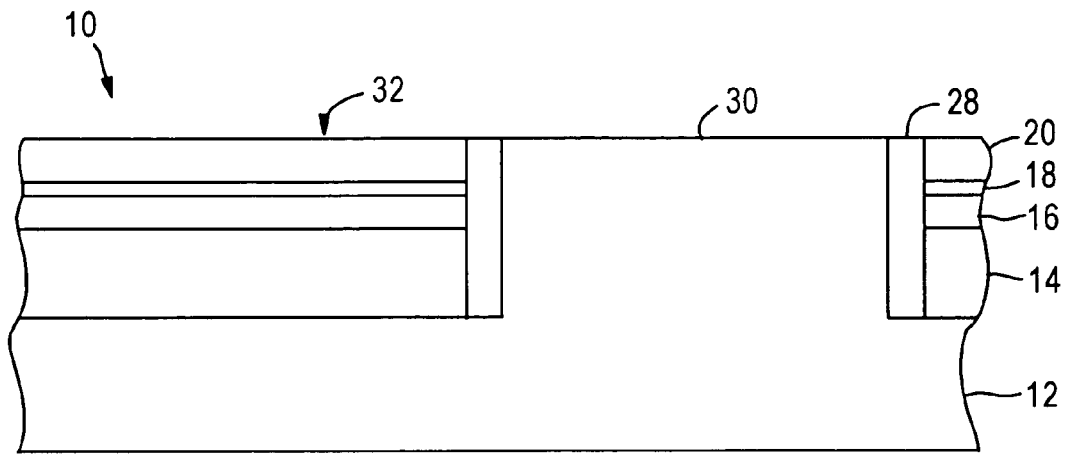

A selective epitaxial silicon layer 30 is grown on the silicon substrate 12, so that it extends over the top of the opening 22, as shown in FIG. 6. The epitaxial silicon layer 30 has the same crystal orientation as the silicon substrate 12. After the selective epitaxial silicon growth, conventional chemical-mechanical polishing (CMP) techniques are used to polish the epitaxial silicon layer 30 so that it is substantially coplanar with an upper surface 32 of the second silicon nitride layer 20, as shown in FIG. 7.

Figure 8:
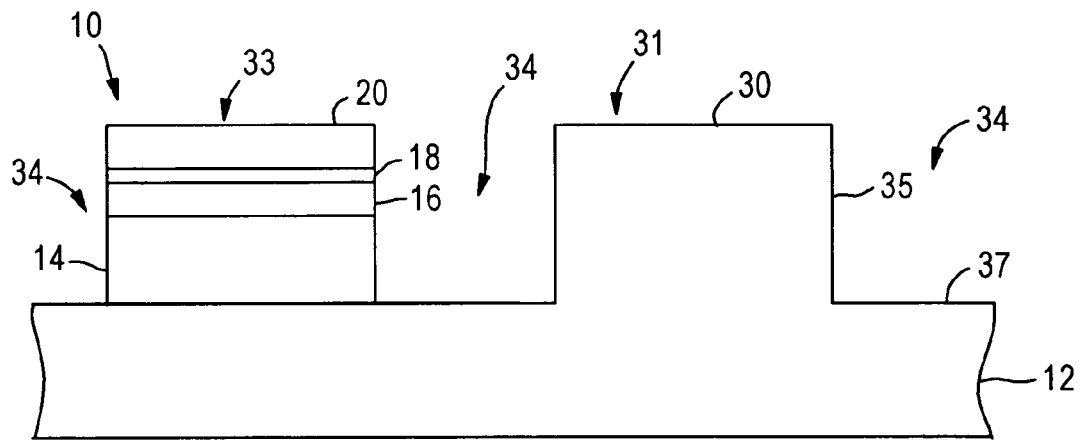

First regions 31 of the SOI structure 10 and second regions 33 are isolated from each other using conventional shallow trench isolation (STI) techniques. As shown in FIG. 8, trenches 34 are formed in the SOI structure 10 exposing the surface 37 of the silicon substrate 12. The trenches 34 are formed by conventional photolithographic and etching techniques, including depositing a photoresist on the SOI structure 10, selectively exposing and patterning the photoresist, anisotropic etching, and removal of the remaining photoresist to form trenches 34, as illustrated in FIG. 8. The trenches 34 are positioned around the nitride sidewalls 28, such that as the anisotropic etch is performed the nitride sidewalls 28 are removed from the structure 10.

Figure 9:
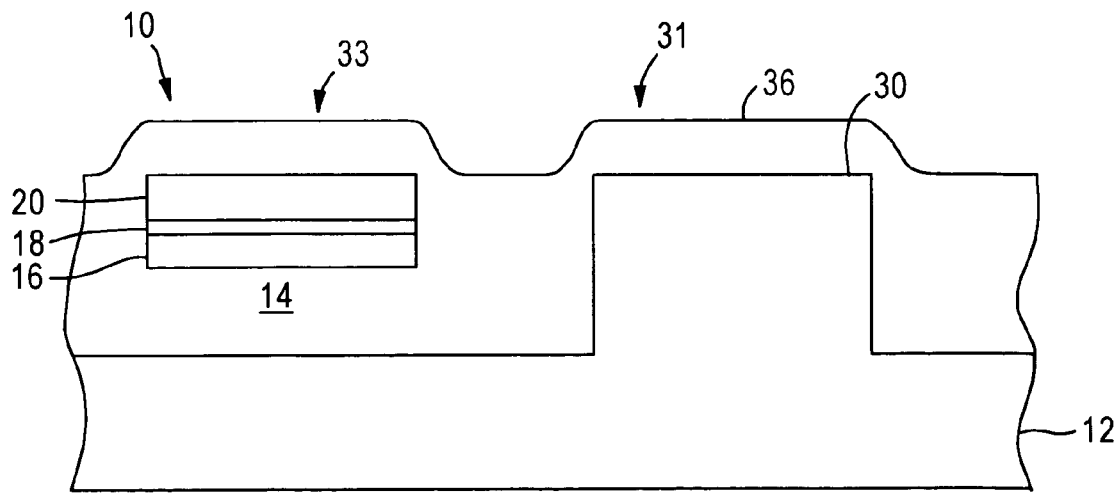

The trenches 34 are subsequently are filled with a suitable insulating material 36 as by a conventional CVD process as shown in FIG. 9. Suitable insulating materials 36 include silicon nitride and silicon oxide. In certain embodiments of the present invention, trench regions 34 are filled with silicon oxide 36 to isolate the first region 31 and the second region 33. Some of the conventional methods of filling trench region 34 with silicon oxide include:

(a) tetraethylorthosilicate low pressure chemical vapor deposition (TEOS LPCVD),
(b) non-surface sensitive TEOS ozone atmospheric or sub-atmospheric pressure chemical vapor deposition (APCVD or SACVD), and
(c) silane oxidation high-density plasma CVD.

Figure 10:
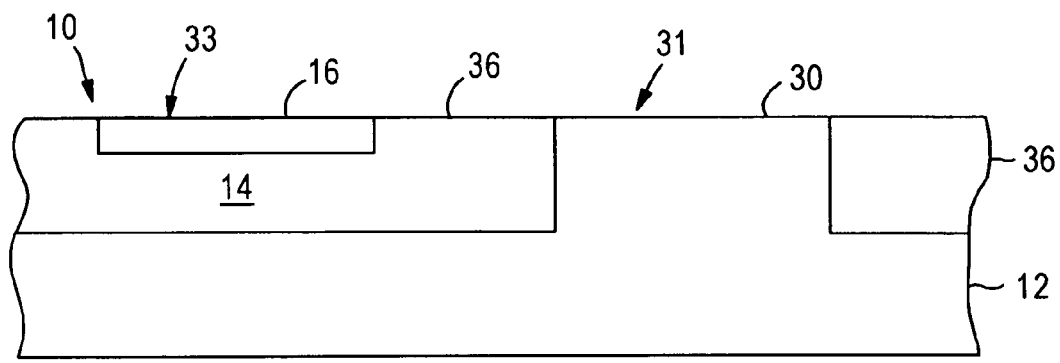

Prior to filling trenches 34 with silicon oxide 36, thermal oxide liners (not shown) are conventionally grown along the walls 35 of the trenches 34, such as by exposing the structure 10 to an oxygen ambient at a temperature of approximately 950° C. to about 1100° C. The structure 10 is subsequently planarized by CMP to remove the oxide 36 extending over the trenches 34. After planarizing, the nitride layer 20 and oxide layer 18 are subsequently removed, as shown in FIG. 10. The nitride layer 20 and oxide layer 18 are typically removed by wet etching. Hot phosphoric acid is conventionally used to etch silicon nitride and hydrofluoric acid or a mixture of hydrofluoric and ammonium fluoride (buffered oxide etch) is used to remove silicon oxide layers. In the resulting structure 10, the silicon layer 16 in the second region 33 is isolated from silicon layer 30, illustrated in FIG. 10.

Figure 11A:
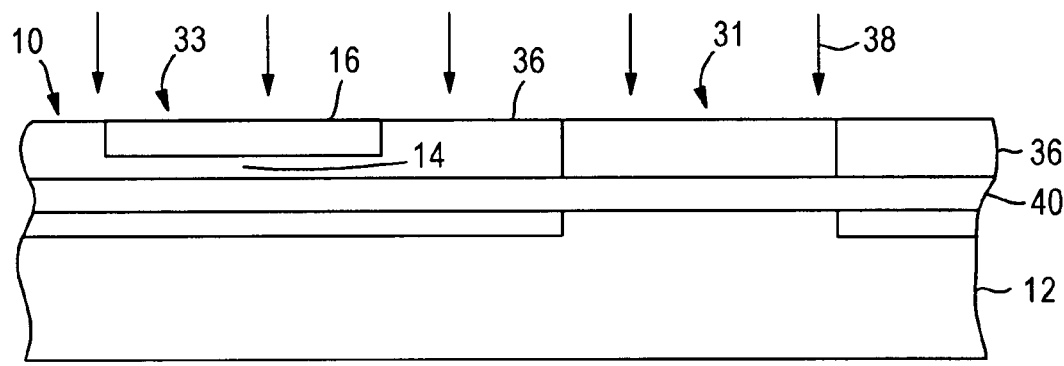
Figure 11B:
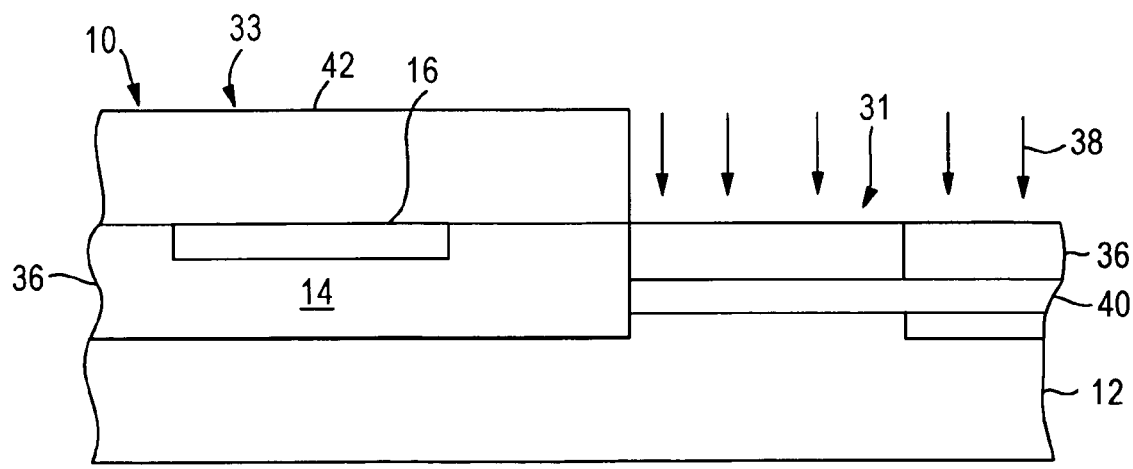

An insulating BOX layer 40 is subsequently formed by a SIMOX process, as illustrated in FIG. 11A. In the SIMOX process, oxygen ions 38 are implanted into the structure 10. In certain embodiments of the present invention, oxygen ions 38 are implanted into the structure 10 at an energy in the range of from about 70 keV to about 200 keV and at a dose in the range from about $1.0 \times 10^{17}$ cm$^{-2}$ to about $1.0 \times 10^{18}$ cm$^{-2}$. After implantation, the structure 10 is annealed at a temperature in the range of from about 1250° C. to about 1400° C. for about 4 to about 6 hours. In an alternate embodiment of the present invention, a hard oxide mask 42 is formed over the second region 33 using conventional deposition, photolithographic, and etching techniques, to protect the second region 33 from damage during the oxygen ion 38 implant in the first region 31, as shown in FIG. 11B. In certain embodiments of the present invention, the insulating layer 40 underlying the first region 31 has a thickness less than the thickness of the insulating layer 14 underlying the second region 33.

Figure 12:
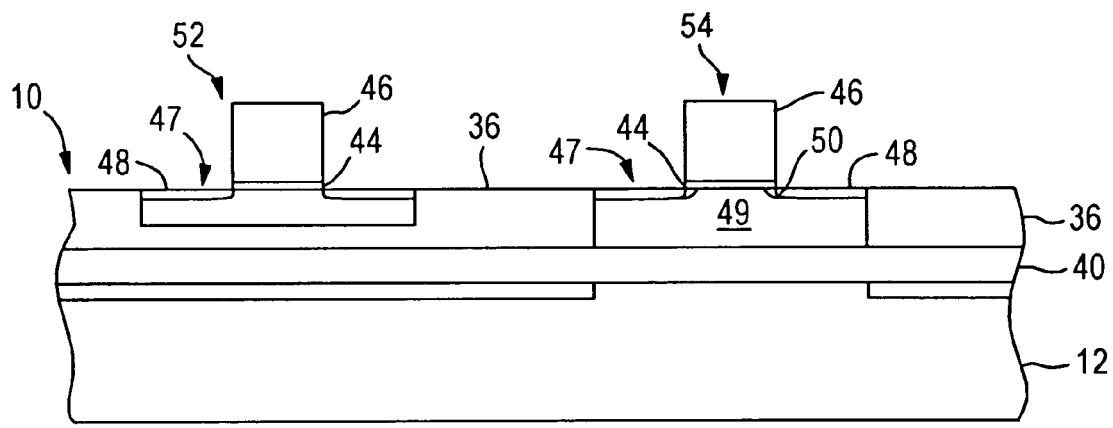

As illustrated in FIG. 12, a fully depleted MOSFET 52 and partially depleted MOSFET 54 are formed on the SOI structure 10. A gate oxide layer 44 and gate electrode layer 46 are formed over the structure 10. In certain embodiments of the present invention, the gate electrode layer 46 comprises polysilicon and is formed to a thickness of about 100 nm to about 300 nm. The gate oxide layer 44 is typically formed to thickness of about 10 Å to about 100 Å. The gate oxide layer 44 and gate electrode layer 46 are patterned by conventional photolithographic and etching techniques.

Source and drain extensions 48 are formed by conventional ion implantation techniques. The type of dopant implanted into the source and drain extensions 48 depends on whether the device is a NMOSFET or a PMOSFET. For example, if the transistor is a NMOSFET, N-type dopant is implanted into the source and drain extensions 48. In certain embodiments of the present invention, N-type dopant, such as arsenic, is implanted into the source and drain extensions 48 at an implantation dose of about $1 \times 10^{14}$ ions/cm$^2$ to about $2 \times 10^{15}$ ions/cm$^2$ and an implantation energy of about 0.5 keV to about 5 keV. If the transistor is a PMOSFET, P-type dopant is implanted into the source and drain extensions 48. In certain embodiments of the present invention, P-type dopant, such as boron difluoride (BF$_2$), is implanted into the source/drain extensions 48 at an implantation dose of about $1 \times 10^{14}$ ions/cm$^2$ to about $1 \times 10^{15}$ ions/cm$^2$ and an implantation energy of about 0.5 keV to about 5 keV.

Halo implants 50 are formed in the channel region 49, adjacent the source and drain regions 47 of the partially depleted MOSFET 54. The halo implants 50 are formed with a dopant of a conductivity type opposite that of the source and drain regions 47. The halo implants 50 can be formed by an angled implant in certain embodiments of the present invention. The halo implants 50, in certain embodiments of the present invention, can be implanted at a dose of about $8 \times 10^{12}$ ions/cm$^2$ to about $5 \times 10^{13}$ ions/cm$^{-2}$ and an implantation energy of from about 7 keV to about 50 keV. Halo implants 50 prevent merger of the source and drain regions in the channel region 49. The threshold voltage of the partially depleted MOSFET 54 can be modified by adjusting the halo dose.

Figure 13:
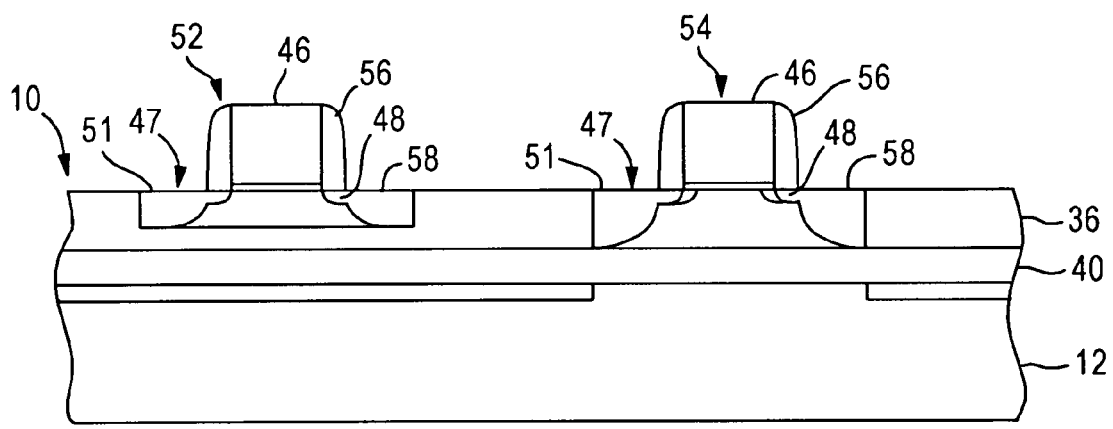

The heavily doped portions 51 of the source and drain regions 47 are subsequently formed. As shown in FIG. 13, sidewall spacers 56 are formed surrounding the gate electrode 46 by conventional methods, such as the deposition of a layer of insulating material, including silicon nitride or silicon oxide, followed by anisotropic etching to form the sidewall spacers 56. In certain embodiments of the present invention, if the transistor is a NMOSFET arsenic is implanted into the heavily doped regions 51 at an implantation dose of about $1 \times 10^{15}$ ions/cm$^2$ to about $4 \times 10^{15}$ ions/cm$^2$ and an implantation energy of about 20 keV to about 50 keV. If the transistor is a PMOSFET, boron is implanted into the heavily doped region 51 at an implantation dose of about $1 \times 10^{15}$ ions/cm$^2$ to about $4 \times 10^{15}$ ions/cm$^2$ and an implantation energy of about 2 keV to about 10 keV.

Figure 14:
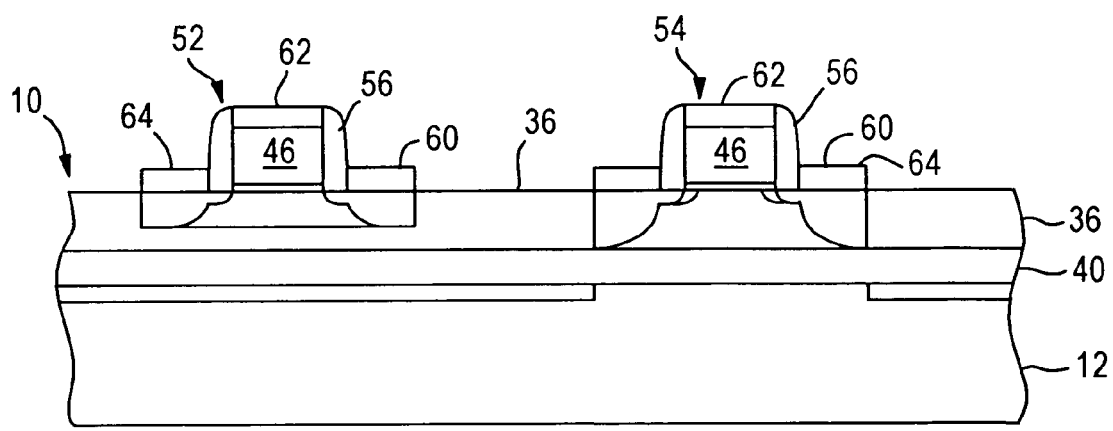

In certain embodiments of the present invention, raised source and drain regions 60 are formed on source and drain regions 47 by doped selective epitaxy, as shown in FIG. 14. In certain embodiments of the present invention, a doped epitaxial layer is grown to a thickness of from about 300 Å to about 1000 Å on the source and drain regions 47. Doped selective epitaxy is performed with a mixture of gases including silane (SiH$_4$) and a dopant gas in a hydrogen carrier gas. HCl gas may be added to the SiH$_4$/dopant gas mixture. The epitaxial layer is formed at a temperature of about 650° C. to about 900° C. at a pressure from about 1 torr to about 700 torr.

In certain alternate embodiments of the present invention, raised silicon layers (not shown) are grown over the source and drain regions 47 by selective epitaxy. The raised silicon layers are grown to a thickness such that the entire raised silicon layers are consumed when the metal silicide contacts are formed as subsequently described herein. Because the entire raised silicon layers are consumed it is not necessary to implant dopants in the raised silicon layers.

Metal silicide contacts 64 are subsequently formed in the raised source and drain regions 60 and metal silicides contacts 62 are formed over the gate electrodes 46. Conventional techniques for forming metal silicide contacts include depositing a metal layer such as nickel, cobalt, or titanium over the structure 10. Metal silicide contacts 62, 64 are formed by heating the metal layer to react it with underlying silicon in the raised source and drain regions 60 and gate electrode 46. After formation of the metal silicide contacts 60, 62 the metal layer which did not react to form metal silicide is removed by etching. The raised source and drain regions 60 are needed in the fully depleted MOSFET 52 source and drain regions 47 because there is insufficient space in the thin fully depleted MOSFET 52 source and drain regions 47 to accommodate metal silicide contacts 64 of sufficient thickness.

Figure 15:
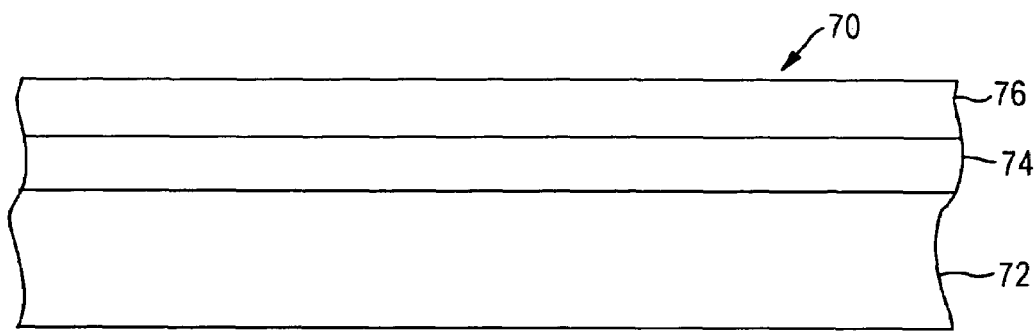
FIGS. 15-28 illustrate the formation of a SOI semiconductor device with MOSFETs formed on silicon of different crystal orientations on the same substrate.

In another embodiment of the present invention, a SOI structure 70 is provided with a substrate 72 comprising silicon having a first crystal orientation, an insulating BOX layer 74 and silicon layer 76 comprising silicon having a second crystal orientation, as illustrated in FIG. 15. SOI wafers comprising a silicon layer having a different crystal orientation than the silicon substrate are known as hybrid orientation wafers. In certain embodiments of the present invention, the SOI structure 70 comprises a silicon substrate 72 having a <100> crystal orientation and a silicon layer 76 having a <110> crystal orientation. In certain other embodiments of the present invention, the substrate 72 comprises silicon having a <110> crystal orientation, while the silicon layer 76 comprises silicon having a <100> crystal orientation. Hybrid substrates can be prepared through wafer bonding techniques, wherein a first silicon substrate having a <100> crystal orientation is bonded to a silicon substrate having a <110> crystal orientation. In certain embodiments of the present invention the silicon layer 76 is formed to a thickness of about 30 nm to about 100 nm and the thickness of the BOX layer 74 ranges from about 200 nm to about 300 nm.

The present invention is not limited to silicon layers with different crystal orientations, wherein the different crystal orientations are the <100> and <110> orientations. As is clear to one of ordinary skill in this art, the present invention is applicable to any two silicon crystal orientations, including the <111> and <311> orientations. In addition, crystal planes angled to any of the above orientations are included within the scope of the present invention.

Figure 16:
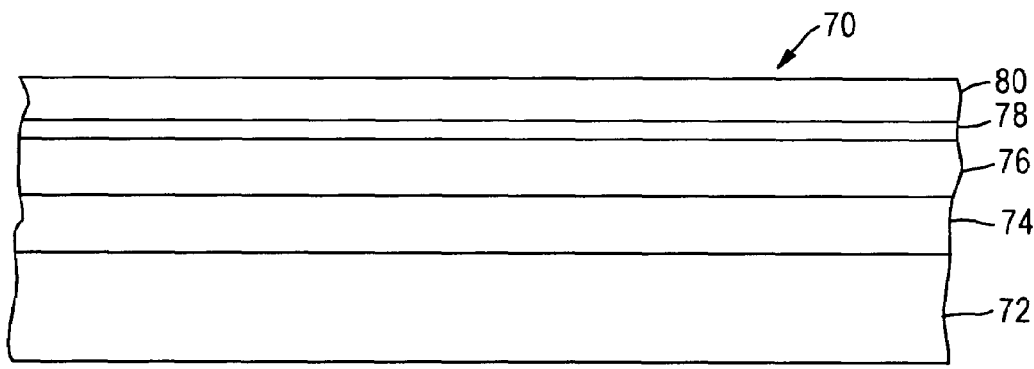
Figure 17:
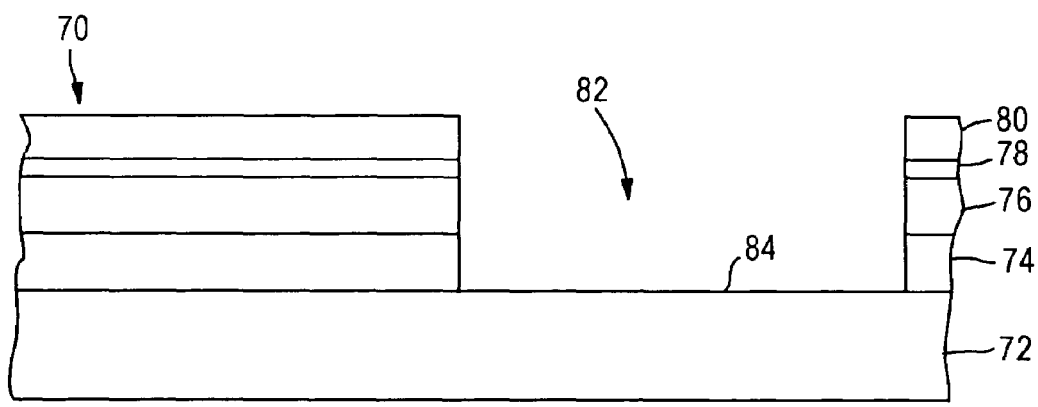

As illustrated in FIG. 16, an oxide layer 78 and silicon nitride layer 80 are subsequently formed over the silicon layer 76, as previously described. As shown in FIG. 17, an opening 82 is formed in the SOI structure 70 to expose an upper surface 84 of the silicon substrate 72. The opening 82 is formed by conventional photolithographic and etching techniques, as previously described.

Figure 18:
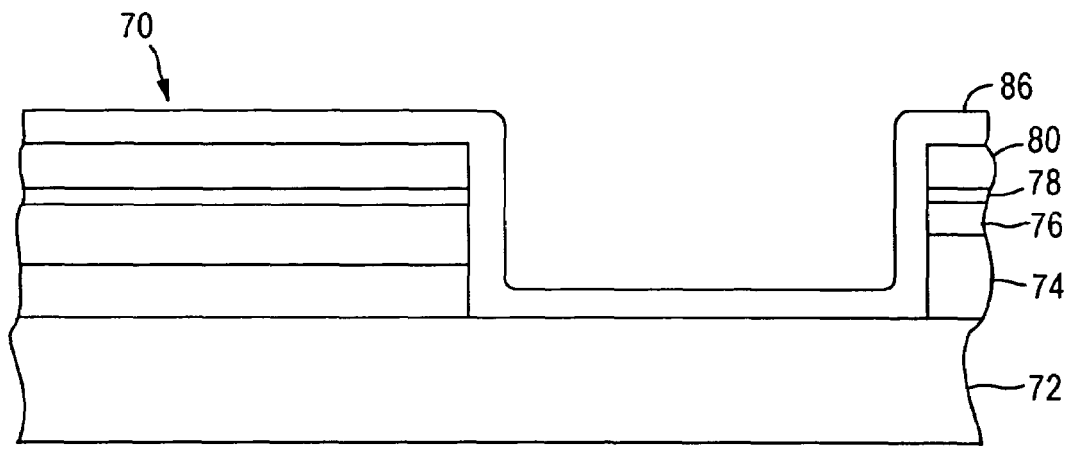
Figure 19:
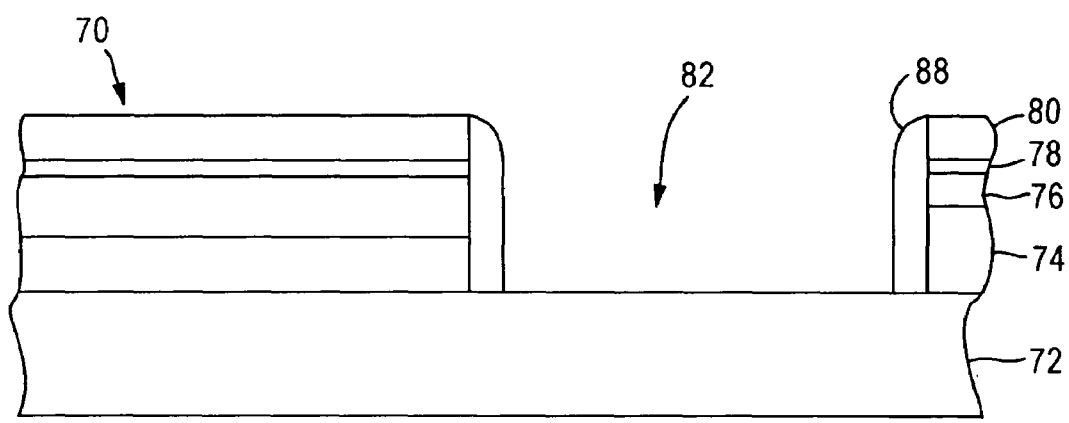
Figure 20:
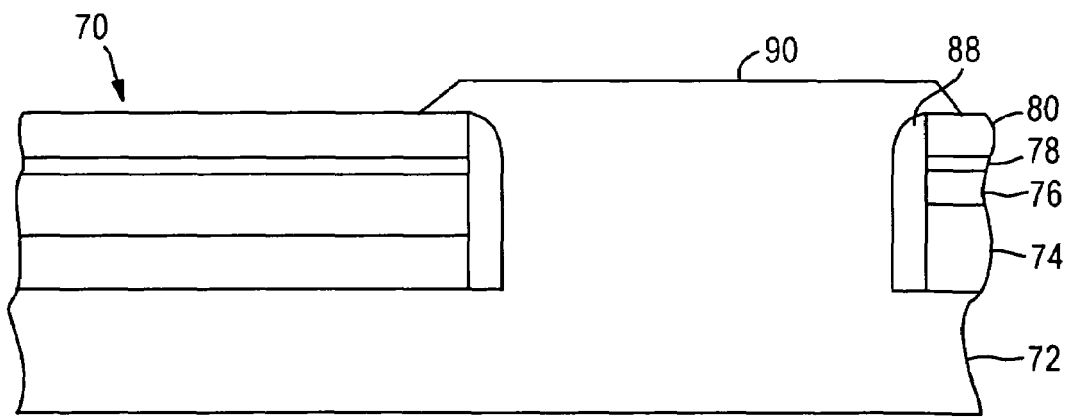
Figure 21:
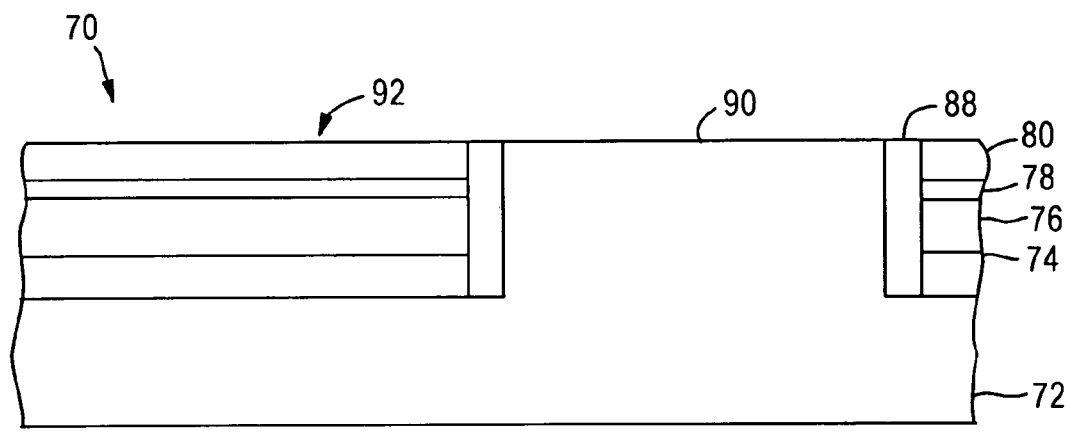

As illustrated in FIG. 18, a second silicon nitride layer 86 is deposited over the SOI structure 70. The second silicon nitride layer 86 is subsequently anisotropically etched to form sidewall spacers 88 in the opening 82. A selective epitaxial silicon layer 90 is subsequently grown on top of the silicon substrate 72 so that it extends above the opening 80. The epitaxial silicon layer 90 has the same crystal orientation as the silicon substrate 72. The SOI structure 70 is subsequently planarized using CMP techniques so that the epitaxial silicon layer 90 is substantially coplanar with an upper surface 92 of the second silicon nitride layer 80, as illustrated in FIG. 21.

Figure 22:
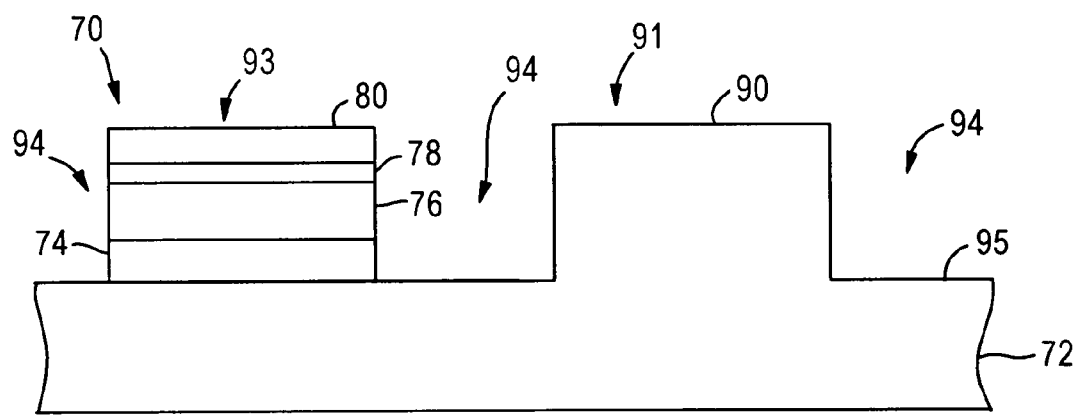
Figure 23:
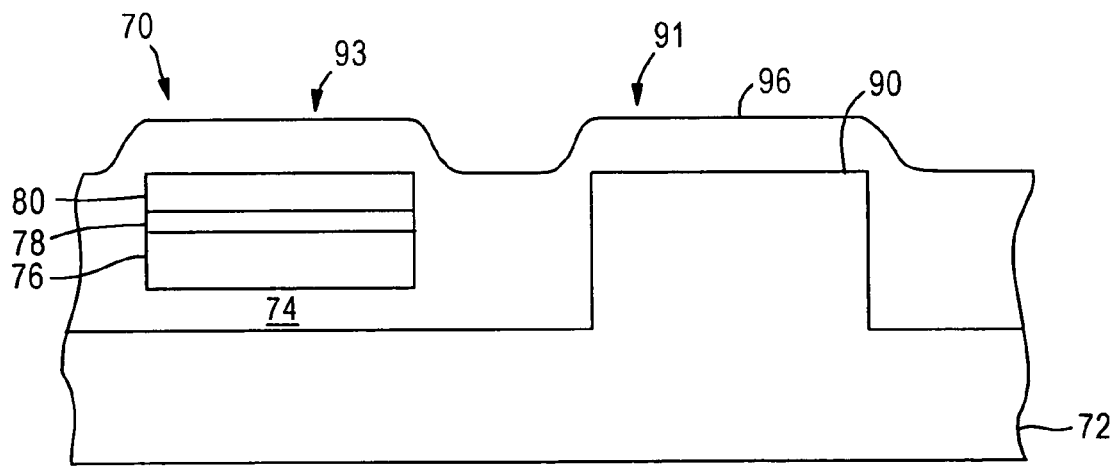
Figure 24:
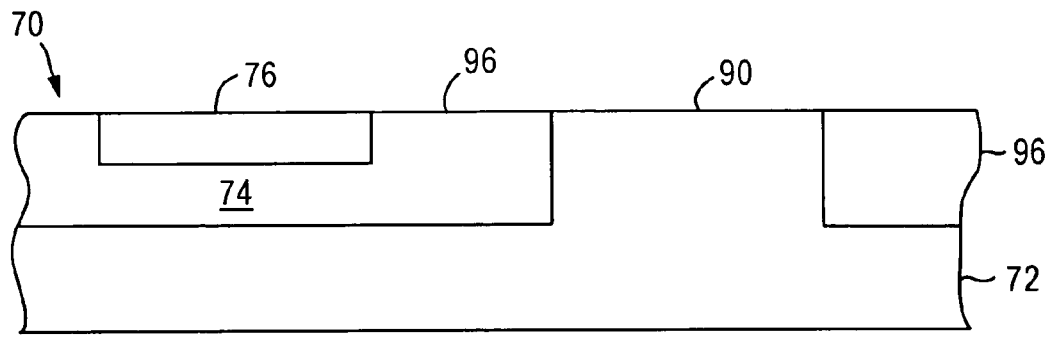

As illustrated in FIG. 22, trenches 94 are formed in the SOI structure 70 exposing an upper surface 95 of the silicon substrate 72. The trenches 94 are formed to isolate a first region 91 of the SOI structure 70 from a second region 93. The trenches 94 are formed and subsequently filled with an appropriate insulating material according to conventional STI techniques, as previously explained. The trenches 94 are positioned so as to remove the side wall spacers 88 while forming the trenches 94. The trenches 94 are subsequently filled with an appropriate insulating material 96, such as silicon oxide, as illustrated in FIG. 23. The deposited silicon layer 96 is subsequently planarized using CMP techniques, and the second silicon nitride layer 80 and oxide layer 78 are removed by the use of appropriate etchants, as previously described, to provide the planarized structure 70, as shown in FIG. 24.

Figure 25A:
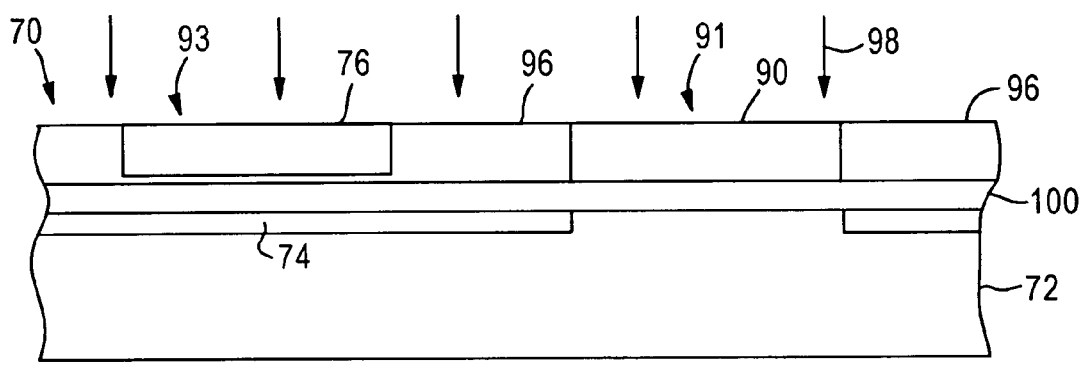
Figure 25B:
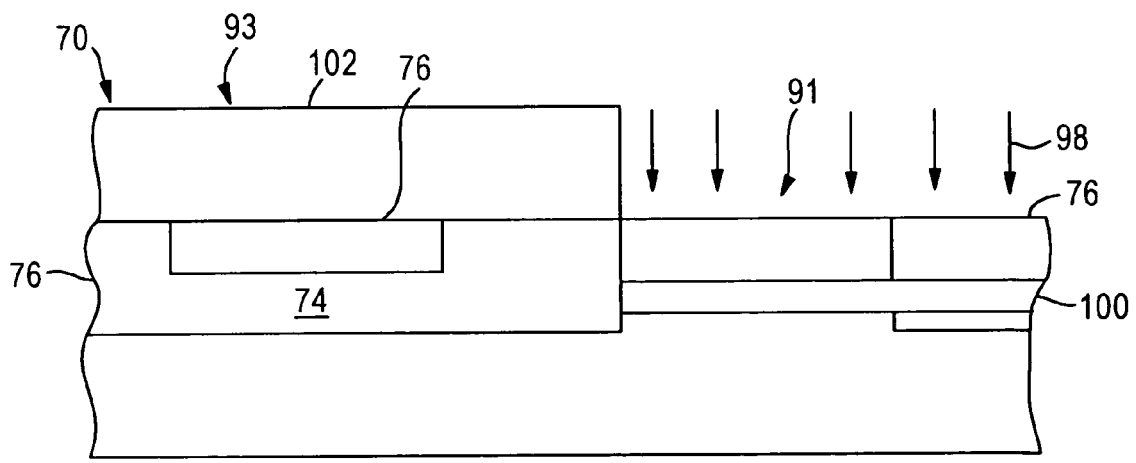

As previously described, oxygen ion 98 is implanted into the structure 70 to form an insulating BOX layer 100, as shown in FIG. 25A. In an alternate embodiment of the invention, a silicon oxide or silicon nitride hard mask 102 protects the second region 93 from damage during implantation of oxygen ion 98 into the first region 91. The structure 70 is subsequently thermally annealed. As a result of the SIMOX process, the resulting structures 70 of FIGS. 25A and 25B comprise a first region 91 and second region 93 with silicon-on-insulator configurations, wherein the first region 91 and second region 93 comprise silicon having different crystal orientations. In certain embodiments of the present invention, the insulating layer 100 underlying the first region 91 has a thickness less than the thickness of the insulating layer 74 underlying the second region 93.

Figure 26:
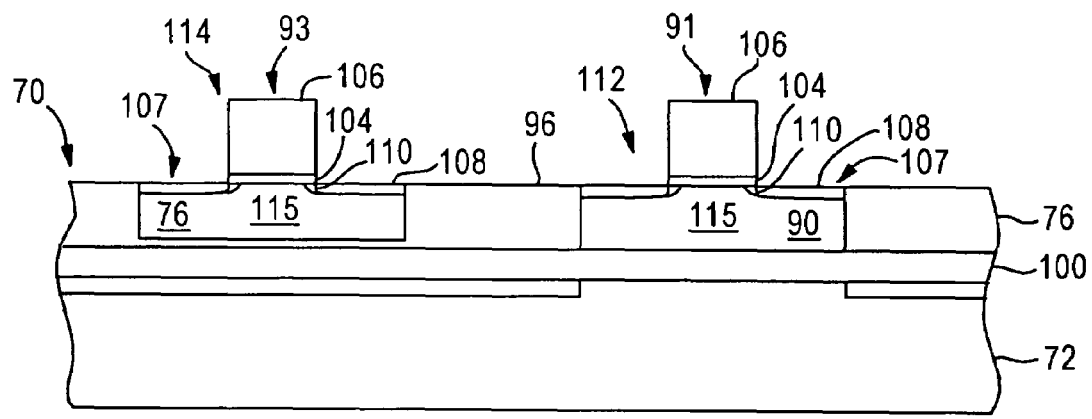

A structure 70 comprising a plurality SOI MOSFETs with different silicon crystal orientations is subsequently formed. As illustrated in FIG. 26, gate electrodes 106 and gate oxide layers 104 are formed over the first region 91 comprising the silicon layer 90 having a first crystal orientation and the second region 93 comprising silicon having a second crystal orientation. Source and drain extensions 108 are formed by ion implantation techniques in the source and drain regions 107 and halo implants 110 are optionally formed in the channel regions 115. The threshold voltage of the first and second MOSFETs 112, 114 can be modified by adjusting the halo implant dose.

Figure 27:
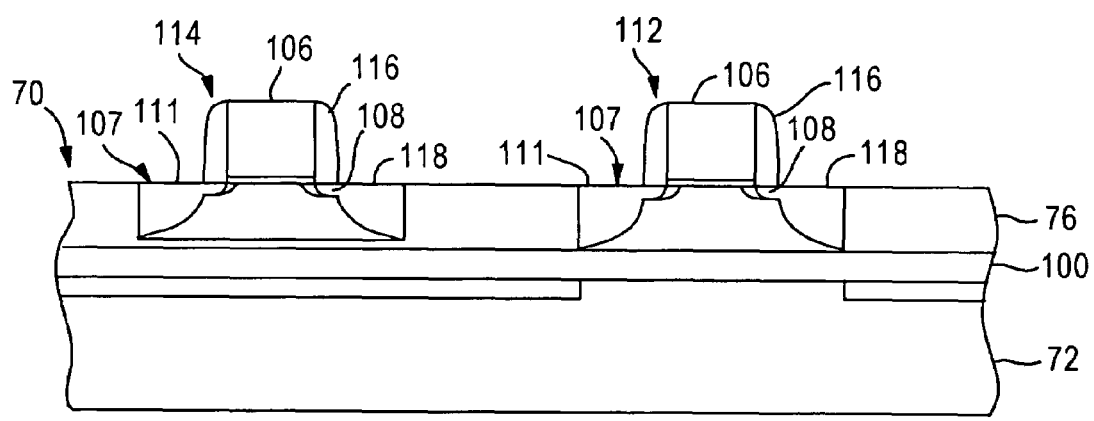

As shown in FIG. 27, gate sidewall spacers 116 are formed on the gate electrodes 106 by depositing an insulating material such as silicon oxide or silicon nitride over the structure 70 and subsequent anisotropic etching. Heavily doped regions 111 are formed in the source and drain regions 107 by conventional techniques such as ion implantation. As previously described, a PMOSFET is formed by implanting P-type dopant into the source and drain regions 107 and a NMOSFET is formed by implanting N-type dopant into the source and drain regions 107. Because PMOSFET performance can be greatly enhanced by fabricating PMOSFETs on silicon with a <110> crystal orientation, the silicon layer comprising <110> crystal orientation silicon is doped with a P-type dopant in the source and drain regions 107. The silicon layer comprising <100> crystal orientation silicon is doped with N-type dopant to form a NMOSFET.

Figure 28:
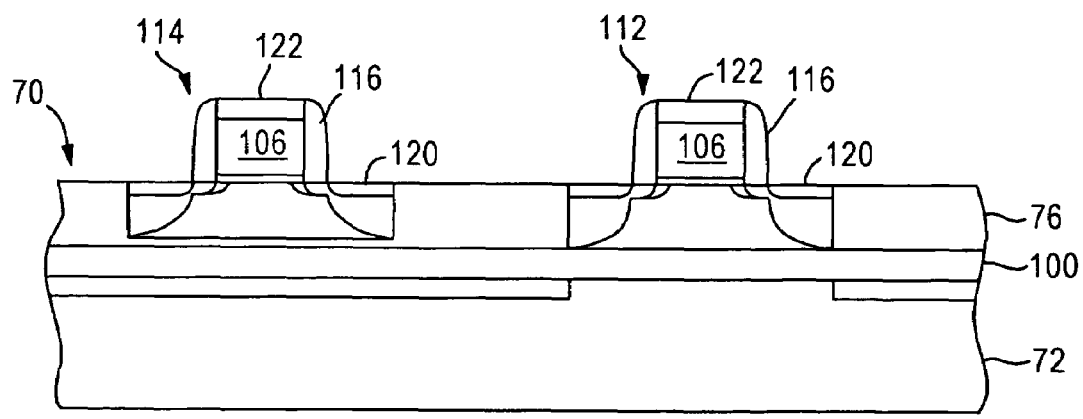

A metal layer is subsequently deposited over the structure 70. The structure is heated to react the metal layer with underlying silicon in the source and drain regions 107 and gate electrodes 106 to form metal silicide contacts 120, 122 in the source and drain regions 107 and on the gate electrodes 106, as shown in FIG. 28.

Figure 29:
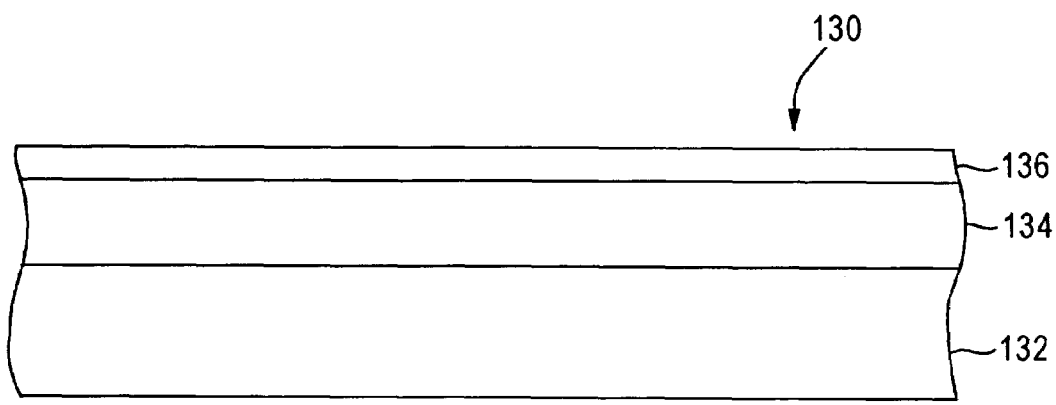
FIG. 29 illustrates a silicon-on-insulator structure wherein the silicon substrate comprises silicon of a different crystal orientation than the silicon-on-insulator silicon layer.
Figure 30:
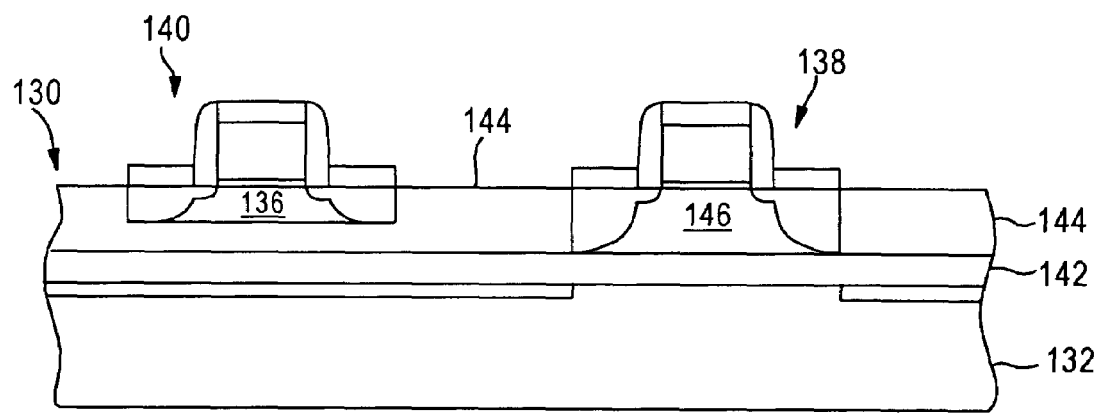
FIG. 30 illustrates a semiconductor device comprising silicon-on-insulator technology, fully depleted MOSFET technology, and MOSFETs formed on silicon of different crystal orientation on the same substrate.

In certain embodiments of the present invention a SOI structure 130 comprising a silicon substrate 132 of a first crystal orientation, a BOX layer 134, and a silicon layer 136 of a second crystal orientation, as illustrated in FIG. 29, is provided. The SOI structure 130 is processed in accordance with the steps described in FIG. 2 through FIG. 14 to provide a partially depleted MOSFET 138 comprising a silicon layer 146 having a first crystal orientation and a fully depleted MOSFET 140 with a silicon layer 136 of a second crystal orientation 148 overlying the BOX layer 142. In an alternate embodiment of the present invention, the BOX layer 142 does not extend under the fully depleted MOSFET 140, as previously described in relation to FIG. 11B.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A method of forming a semiconductor device comprising:
   providing a silicon-on-insulator structure comprising a substrate with a silicon layer overlying said substrate and a first insulating layer interposed therebetween;
   forming an opening in a first region of said silicon-on-insulator structure by removing a portion of said silicon layer and said first insulating layer to expose a portion of said substrate layer;
   selectively growing epitaxial silicon in said opening;

forming a second insulating layer in said silicon grown in the opening in the first region to provide an insulating layer between the grown silicon in the opening and the substrate, wherein the second insulating layer has a thickness in said first region less than a thickness of the first insulating layer in a second region of the structure; and forming a partially depleted MOSFET in the first region and a fully depleted MOSFET in the second region.

2. The method of forming a semiconductor device according to claim 1, wherein said step of forming said second insulating layer comprises implanting oxygen ion into said deposited silicon.

3. The method of forming a semiconductor device according to claim 1, further comprising forming insulating sidewall spacers on sidewalls of said opening.

4. The method of forming a semiconductor device according to claim 3, further comprising forming insulating regions in said structure to insulate said first regions from said second regions.

5. The method of forming a semiconductor device according to claim 4, wherein said step of forming insulating regions comprises removing said insulating sidewall spacers.

6. The method of forming a semiconductor device according to claim 1, wherein said structure comprises second regions spaced apart from said first regions, and the silicon layer overlying the second insulating layer in the first region comprises silicon having a first crystal orientation and the silicon layer overlying the first insulating layer in the second region comprises silicon having a second crystal orientation.

7. The method of forming a semiconductor device according to claim 6, wherein the substrate comprises silicon having the first crystal orientation.

8. The method of forming a semiconductor device according to claim 7, wherein said first crystal orientation and said second crystal orientation are selected from the group of silicon crystal orientations consisting of <100>, <110>, <111>, <311>, and crystal planes angled to these orientations.

9. The method of forming a semiconductor device according to claim 7, wherein the silicon having the first crystal orientation has a <100> crystal orientation and the silicon having the second crystal orientation has a <110> crystal orientation.

10. The method of forming a semiconductor device according to claim 9, further comprising a forming a NMOSFET in the first region and forming a PMOSFET in the second region.

11. The method of forming a semiconductor device according to claim 1, wherein the grown silicon layer is grown by doped selective epitaxial deposition.

12. A method of forming a semiconductor device comprising:

providing a silicon-on-insulator structure comprising a substrate with a silicon layer overlying said substrate and a first insulating layer interposed therebetween;

forming an opening in a first region of said silicon-on-insulator structure by removing a portion of said silicon layer and said first insulating layer to expose a portion of said substrate layer;

selectively growing epitaxial silicon in said opening;

forming a second insulating layer in said silicon grown in the opening in the first region to provide an insulating layer between the grown silicon in the opening and the substrate, wherein the second insulating layer has a thickness in said first region less than a thickness of the first insulating layer in a second region of the structure;

forming a partially depleted MOSFET in the first region and a fully depleted MOSFET in the second region; and forming raised source and drain regions overlying said silicon layers.

13. The method of forming a semiconductor device according to claim 12, further comprising forming silicide contacts in said raised source and drain regions.

14. The method of forming a semiconductor device according to claim 12, further comprising forming halo implants in the partially depleted MOSFET.

* * * * *

UNITED STATES PATENT AND TRADEMARK OFFICE
CERTIFICATE OF CORRECTION

| | | |
|---|---|---|
| PATENT NO. | : 7,235,433 B2 | Page 1 of 1 |
| APPLICATION NO. | : 10/976780 | |
| DATED | : June 26, 2007 | |
| INVENTOR(S) | : Andrew M. Waite et al. | |

It is certified that error appears in the above-identified patent and that said Letters Patent is hereby corrected as shown below:

Title Page,
Item "(56) References Cited", under "OTHER PUBLICATIONS", insert the following publication: -- Web Pages from http://www.ibis.com/simox.htm --.

Signed and Sealed this

Second Day of October, 2007

JON W. DUDAS
*Director of the United States Patent and Trademark Office*